(12) United States Patent
Leong et al.

(10) Patent No.: US 6,964,598 B1
(45) Date of Patent: Nov. 15, 2005

(54) POLISHING APPARATUS AND METHOD FOR FORMING AN INTEGRATED CIRCUIT

(75) Inventors: Lup San Leong, Singapore (SG); Feng Chen, Singapore (SG); Charles Lin, Singapore (SG)

(73) Assignee: Chartered Semiconductor Manufacturing Limited, Singapore (SG)

( * ) Notice: Subject to any disclaimer, the term of this patent is extended or adjusted under 35 U.S.C. 154(b) by 211 days.

(21) Appl. No.: 09/904,828

(22) Filed: Jul. 12, 2001

Related U.S. Application Data

(62) Division of application No. 09/415,364, filed on Oct. 8, 1999, now Pat. No. 6,376,378.

(51) Int. Cl.[7] .................... B24B 49/00; B24B 51/00
(52) U.S. Cl. ................ 451/6; 451/9; 451/527; 451/529; 451/550
(58) Field of Search ................ 451/6, 8, 9, 41, 451/57, 59, 63, 65, 66, 285, 286, 287, 288, 451/289, 290, 527, 529, 550

(56) References Cited

U.S. PATENT DOCUMENTS

| | | | | |
|---|---|---|---|---|
| 3,841,031 A | * | 10/1974 | Walsh | 451/41 |
| 5,297,364 A | * | 3/1994 | Tuttle | 451/527 |
| 5,329,734 A | * | 7/1994 | Yu | 451/41 |
| 5,441,598 A | * | 8/1995 | Yu et al. | 438/692 |
| 5,558,563 A | * | 9/1996 | Cote et al. | 451/41 |
| 5,899,745 A | * | 5/1999 | Kim et al. | 438/692 |
| 6,062,958 A | * | 5/2000 | Wright et al. | 451/288 |
| 6,102,775 A | * | 8/2000 | Ushio et al. | 451/6 |
| 6,142,857 A | * | 11/2000 | Cesna | 451/287 |
| 6,146,250 A | * | 11/2000 | Nagabushnam et al. | 451/41 |
| 6,190,494 B1 | * | 2/2001 | Dow | 156/345.13 |
| 6,248,000 B1 | * | 6/2001 | Aiyer | 451/41 |
| 6,368,184 B1 | * | 4/2002 | Beckage | 451/9 |
| 6,443,809 B1 | * | 9/2002 | Leong et al. | 451/41 |
| 6,454,630 B1 | * | 9/2002 | Tolles | 451/6 |
| 6,572,439 B1 | * | 6/2003 | Drill et al. | 451/5 |

* cited by examiner

Primary Examiner—Timothy V. Eley

(57) ABSTRACT

In one embodiment, a semiconductor substrate (38) is uniformly polished using a polishing pad (16) that has a first polishing region (26), a second polishing region (28), and a third polishing region (30). The semiconductor substrate (38) is aligned to the polishing pad (16), such that the center of the semiconductor substrate (38) overlies the second polishing region (28), and the edge of the semiconductor substrate overlies the first polishing region (26) and the third polishing region (30). During polishing, the semiconductor substrate (38) is not radially oscillated over the surface of the polishing pad, and as a result a more uniform polishing rate is achieved across the semiconductor substrate (38). This allows the semiconductor substrate (38) to be uniformly polished from center to edge, and increases die yield because die located on the semiconductor substrate (38) are not over polished.

7 Claims, 13 Drawing Sheets

POLISHING APPARATUS AND METHOD FOR FORMING AN INTEGRATED CIRCUIT

This application is a divisional of application(s) Ser. No. 09/415,364 filed on Oct. 8, 1999, now U.S. Pat. No. 6,376,378.

FIELD OF THE INVENTION

The present invention relates to integrated circuit fabrication, and more specifically to a polishing apparatus and to a method for polishing a layer of material in an integrated circuit.

BACKGROUND OF THE INVENTION

Polishing processes, and more specifically chemical-mechanical polishing processes, have been used in the semiconductor industry to prepare both single crystal substrates and silicon on insulator substrates. In addition, chemical-mechanical polishing processes have also been used to planarize various conductive and insulating layers subsequently deposited on these substrates, during the integrated circuit fabrication process. For example, chemical-mechanical polishing has been used to planarize interlevel dielectric layers that lie in between two different levels of metal interconnect. Planarizing the interlevel dielectric layer, prior to the formation of the next level of interconnect, is highly desirable because it allows the next level of interconnect to be subsequently patterned and etched without the formation of conductive metal stringers, which can electrically short adjacent metal lines, and without the formation of thinned or notched metal lines, which can adversely effect device reliability. Similarly, chemical-mechanical polishing has been used to planarize conductive materials, such as tungsten, copper, and aluminum, to form planar contact plugs, via plugs, and interconnects. In addition, chemical-mechanical polishing has also been used to form trench isolation. In this process, trenches are formed and then subsequently filled with a deposited dielectric layer, such as silicon dioxide. The dielectric layer is then polished back to form dielectric filled isolation trenches, which are nearly planar with the adjacent active regions. In addition to being planar, the resulting trench isolation is also desirable because it allows the space separating adjacent active regions to be minimized, and thus allows integrated circuits with high device packing densities to be fabricated.

Unfortunately, the conductive and dielectric layers formed on the semiconductor substrate during the integrated circuit fabrication process cannot be uniformly polished with current polishing equipment and polishing processes. One of the main reasons for this is that the polishing rate near the edge of the semiconductor substrate is often much higher than that near the center of the semiconductor substrate. Thus, portions of the conductive and dielectric layers which lie near the edge of the semiconductor substrate are often over-polished, and therefore semiconductor die located near the edge of the semiconductor substrate are lost. These die represent a substantial revenue loss to integrated circuit manufactures.

Accordingly, a need exists for a polishing process and polishing apparatus that can polish semiconductor substrates with improved center to edge uniformity.

BRIEF DESCRIPTION OF THE DRAWINGS

The present invention may be more fully understood by a description of certain preferred embodiments in conjunction with the attached drawings in which.

DETAILED DESCRIPTION OF A PREFERRED EMBODIMENT

The present invention provides a polishing apparatus, and a method for uniformly polishing a layer of material in an integrated circuit therewith. The polishing apparatus comprises a carrier, an alignment detector, and a polishing pad having a first polishing region, a second polishing region, and a third polishing region. The alignment detector accurately aligns the carrier to the second polishing region, and a semiconductor substrates mounted to the carrier is aligned to the polishing pad such that its center overlies the second polishing region, and its edge overlies the first polishing region and the third polishing region by a predetermined amount. During polishing, the semiconductor substrate is not radially oscillated over the surface of the polishing pad, and as a result a more uniform polishing rate is achieved across the semiconductor substrate. This allows the semiconductor substrate to be uniformly polished from center to edge, and increases die yield because die on the semiconductor substrate are not over polished.

Figure 1:
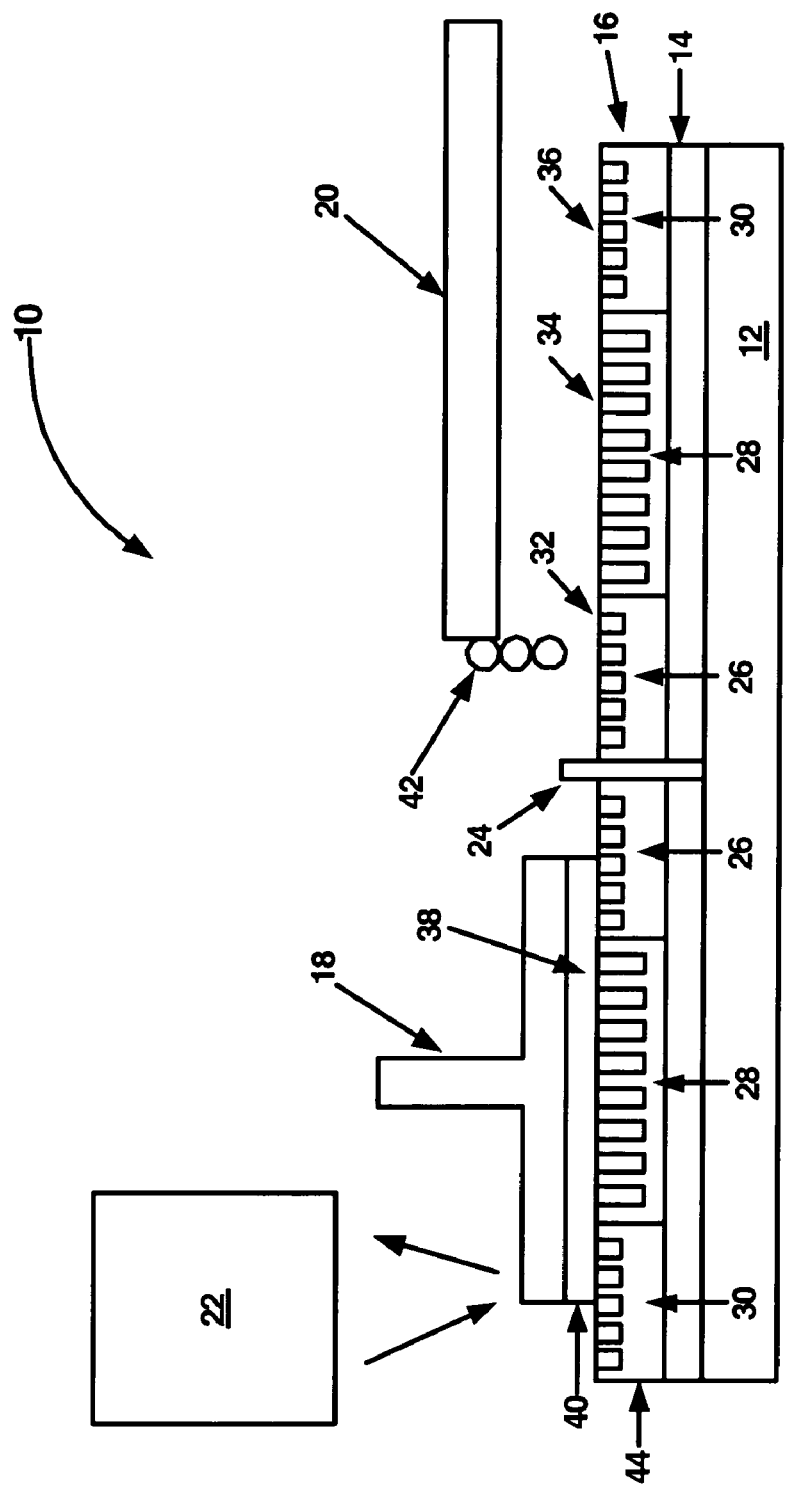
FIG. 1 illustrates, in cross-section, a polishing apparatus in accordance with one embodiment of the present invention.

FIG. 1 illustrates, in cross section, a polishing apparatus 10 in accordance with one embodiment of the present invention. In this particular embodiment, polishing apparatus 10 comprises a polishing platen 12, an under pad 14, a polishing pad 16, a carrier 18, a slurry dispenser 20, and an alignment detector 22.

In one embodiment, polishing platen 12 comprises an alignment knob 24, which is used to align polishing pad 16 and under pad 14 to polishing platen 12, as shown in FIG. 1. It should be appreciated that alignment knob 24 may be formed having either a tapered sidewall, or a vertical sidewall as shown in FIG. 1.

In one embodiment, under pad 14 is a felt based under pad comprising polyurethane. For example, under pad 14 may be a SUBA IV under pad which is commercially available from RODEL, Inc.

Polishing pad 16 comprises a first polishing region 26, a second polishing region 28, and a third polishing region 30. In one embodiment, polishing pad 16 is made of a material comprising polyurethane. It should be appreciated that polishing pad 16 and under pad 14 may be formed as separate pads, or as a composite pad.

In one embodiment, first polishing region 26 comprises holes 32, second polishing region 28 comprises holes 34, and third polishing region 30 comprises holes 36, as shown in FIG. 1. Note as used in this specification, holes are distinguished from pores because holes are formed in the polishing pad after the polishing pad material has been formed. In one embodiment, the holes are used to locally adjust the polishing rate of the semiconductor substrate by supplying differing amounts of slurry to different areas of the semiconductor substrate so that the semiconductor substrate can be more uniformly polished from center to edge.

In one embodiment, a more uniform polishing rate is achieved by providing less slurry to the edge of the semiconductor substrate, than to its center. It should be appreciated that this can be accomplished in a variety of ways. For example, holes 34 may have a greater depth than holes 32 and holes 36 so that more slurry is provided to the center of the semiconductor substrate, as shown in FIG. 1. Alternatively, holes 34 may have a greater width than holes 32 and holes 36, or holes 34 may have a greater width and depth than holes 32 and holes 36 so that more slurry is provided to the center of the semiconductor substrate. Alternatively, second polishing region 28 may have a greater hole density than first polishing region 26 and third polishing region 30, or polishing pad 16 may be formed such that only second polishing region 28 contains holes so that more slurry is provided to the center of the semiconductor substrate.

In an alternative embodiment, a more uniform polishing rate is achieved by providing more slurry to the edge of the semiconductor substrate, than to its center. It should be appreciated that this can also be accomplished in a variety of ways. For example, in this case holes 32 and holes 36 may have a greater depth than holes 34 so that more slurry is provided to the edge of the semiconductor substrate. Alternatively, holes 32 and holes 36 may have a greater width than holes 34, or holes 32 and holes 36 may have a greater width and depth than holes 34 so that more slurry is provided to the edge of the semiconductor substrate. Alternatively, first polishing region 26 and third polishing region 30 may have a greater hole density than second polishing region 28, or polishing pad 16 may be formed such that only first polishing region 26 and third polishing region 30 contain holes so that more slurry is provided to the edge of the semiconductor substrate.

In an alternative embodiment, first polishing region 26 comprises a first pore density, second polishing region 28 comprises a second pore density, and third polishing region 30 comprises a third pore density. Note as used in this specification, pores are distinguished from holes because pores are formed in the polishing pad when the polishing pad material is formed. In this embodiment, first polishing region 26; second polishing region 28, and third polishing region 30 locally adjust the polishing rate of the semiconductor substrate by supplying differing amounts of slurry to different areas of the semiconductor substrate so that the semiconductor substrate can be more uniformly polished from center to edge.

In one embodiment, a more uniform polishing rate is achieved across the semiconductor substrate by providing less slurry to the edge of the semiconductor substrate, than to its center. In this particular embodiment, second polishing region 28 has a pore density which is greater than the pore density of first polishing region 26 and third polishing region 30 so that more slurry is provided to the center of the semiconductor substrate.

In an alternative embodiment, a more uniform polishing rate is achieved across the semiconductor substrate by providing more slurry to the edge of the semiconductor substrate, than to its center. In this particular embodiment, second polishing region 28 has a pore density which is less than the pore density of first polishing region 26 and third polishing region 30 so that more slurry is provided to the edge of the semiconductor substrate.

Carrier 18 is aligned to second polishing region 28, in a manner similar to that used to align a photomask to a semiconductor substrate, using alignment detector 22. More specifically, alignment detector 22 is used to align semiconductor substrate 38 to polishing pad 16 so that semiconductor substrate 38 can be uniformly polished by first polishing region 26, second polishing region 28 and third polishing region 30. In one embodiment, alignment detector 22 comprises a video camera which is used to accurately align carrier 18 to second polishing region 28. In an alternative embodiment, alignment detector 22 comprises a laser which is used to accurately align carrier 18 to second polishing region 28.

The operation of polishing apparatus 10 will now be briefly discussed. A semiconductor substrate 38 is mounted to carrier 18 of polishing apparatus 10, as shown in FIG. 1. Alignment detector 22 then aligns carrier 18 and semiconductor substrate 38 to second polishing region 28. In one embodiment, alignment detector 22 optically locates the outside perimeter of second polishing region 28, and then aligns carrier 18 with respect to the outside perimeter of second polishing region 28. As a result, the center of semiconductor substrate 38 overlies second polishing region 28, and the perimeter 40 of semiconductor substrate 38 overlies first polishing region 26 and third polishing region 30 by a predetermined amount, as shown in FIG. 1. Semiconductor substrate 38 is then rotated by carrier 18, and polishing pad 16 is rotated by polishing platen 12. In addition, slurry 42 is dispensed onto polishing pad 16 by slurry dispenser 20 during polishing. Note, carrier 18 and polishing platen 12 may be rotated in either the same direction, or in opposite directions. It is important to note, that semiconductor substrate 38 is not radially oscillated over the surface of polishing pad 16 during polishing. Therefore, during polishing the center of semiconductor substrate 38 continually overlies second polishing region 28, and remains at a fixed distance from the perimeter 44 of polishing pad 16, while the edge of semiconductor substrate 38 is polished by first polishing region 26 and third polishing region 30. As a result, a more uniform polishing rate is achieved across semiconductor substrate 38, and it is polished with improved center to edge uniformity. It should be appreciated that this improved polishing uniformity increases die yield because die on the semiconductor substrate 38 are not over polished.

Figure 2:
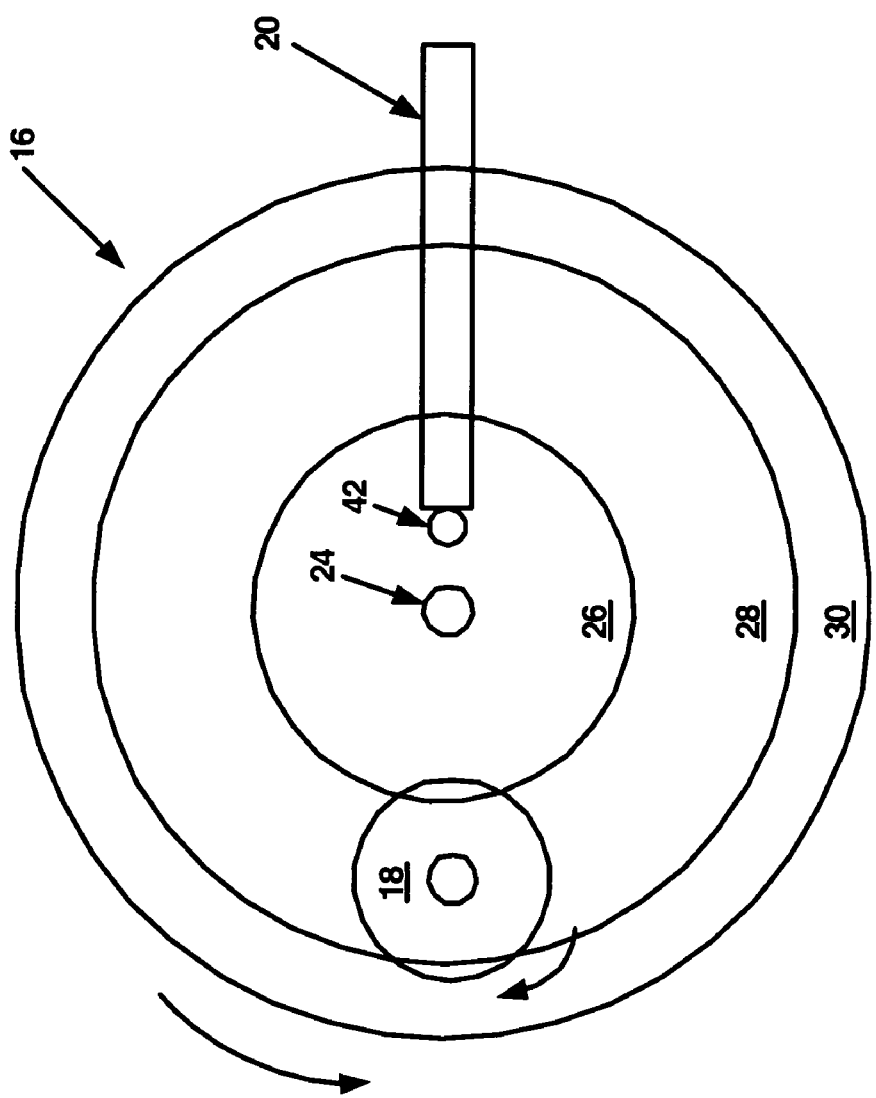
FIG. 2 illustrates, in plan view, a portion of the polishing apparatus of FIG. 1.

FIG. 2 illustrates, in plan view, a portion of polishing apparatus 10 of FIG. 1. Note that, carrier 18 and polishing pad 16 are illustrated as being rotated in opposite directions.

Figure 3:
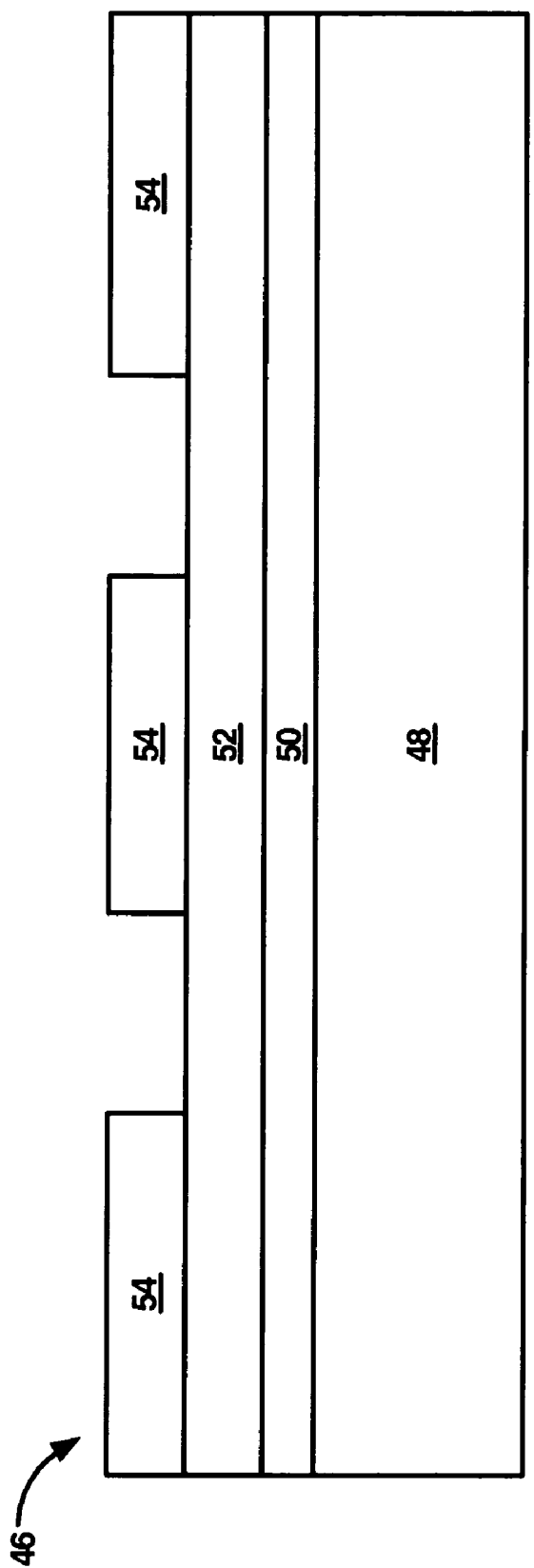
FIGS. 3–6 illustrate, in cross-section, process steps in accordance with one embodiment of the present invention.

FIG. 3 through FIG. 6 illustrate, in cross-section, process steps in accordance with one embodiment of the present invention wherein a trench isolation structure is formed in an integrated circuit. Shown in FIG. 3, is a portion 46 of an integrated circuit structure comprising a semiconductor substrate 48, a buffer layer 50, a polish-stop layer 52, and a photoresist mask 54. Semiconductor substrate 48 is preferably a monocrystalline silicon substrate. Alternatively, semiconductor substrate 48 may be a silicon-on-insulator (SOI) substrate, a silicon-on-sapphire (SOS) substrate, a silicon-germanium substrate, or the like. Buffer layer 50 typically has a thickness ranging from 5 to 100 nanometers, and is preferably a thermal oxide layer which is formed by thermally oxidizing a portion of semiconductor substrate 48. Alternatively, buffer layer 50 may be a chemical vapor deposited silicon oxide layer. Following the formation of buffer layer 50, polish-stop layer 52 is formed over buffer layer 50. Polish-stop layer 52 typically has a thickness ranging from 50 to 200 nanometers, and is preferably a silicon nitride layer. Alternatively, polish-stop layer 52 may be a boronitride layer, a silicon oxynitride layer, or the like. Photoresist mask 54, which overlies a portion of polish-stop layer 52, is formed using standard photolithographic patterning processes.

Figure 4:
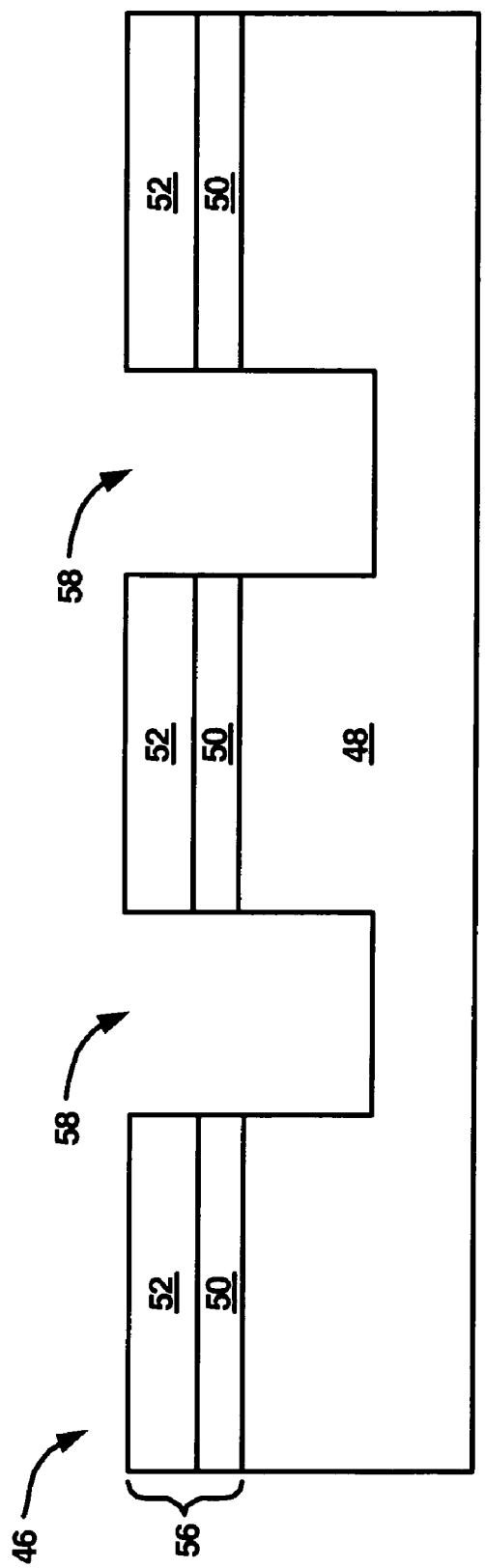

In FIG. 4, photoresist mask 54 is used to etch polish-stop layer 52 and underlying buffer layer 50, and form a patterned trench mask 56 that overlies a portion of semiconductor substrate 48. In addition, semiconductor substrate 48 is etched in regions not covered by patterned trench mask 56 to form trenches 58 in semiconductor substrate 48. Note, patterned trench mask 56 comprises a remaining portion of polish-stop layer 52 and a remaining portion of buffer layer 50. Trenches 58 and patterned trench mask 56 are formed using conventional etching techniques. It should be appreciated that photoresist mask 54 may be removed using conventional photoresist stripping techniques, either before or after trenches 58 have been formed.

Figure 5:
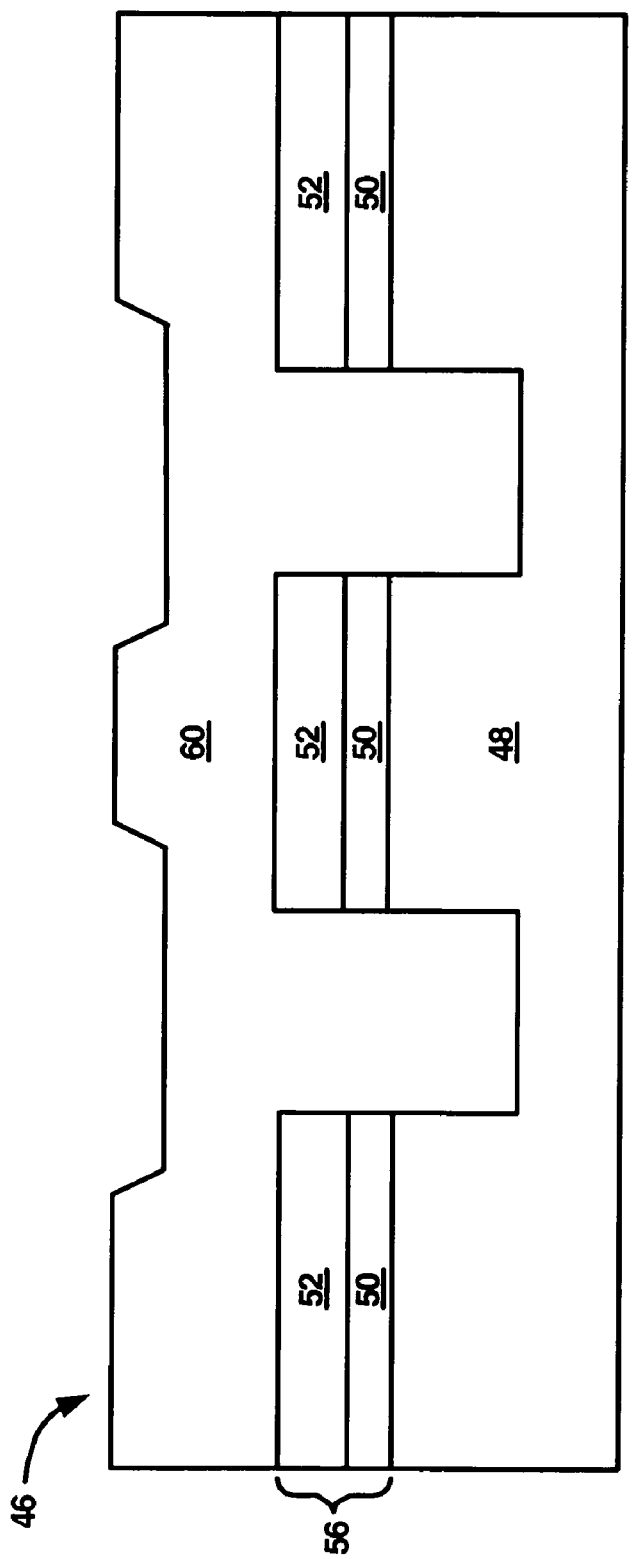

In FIG. 5, a dielectric layer 60 is then formed overlying semiconductor substrate 48. Dielectric layer 60 overlies pattern trench mask 56 and lies within trenches 58, such that it substantially fills trenches 58. In a preferred embodiment, dielectric layer 60 is a layer of plasma oxide, which is formed using a commercially available high density plasma deposition system. In an alternative embodiment, dielectric layer 60 is a layer of chemically vapor deposited oxide, which is deposited using ozone and tetraethylorthosilicate (TEOS) as source gases. It should be appreciated that dielectric layer 60 may also be formed using other dielectric materials, such as germanium oxide, boro-phosphate-silicate-glass (BPSG), phosphate-silicate-glass (PSG), borosilicate-glass (BSG), spin-on-glass, or the like, and that it may be may be formed using other techniques such, electron cyclotron resonance deposition, spin-on deposition, or the like. In addition, it should also be appreciated that a trench liner (not shown) may also be formed within trenches 58 prior to forming dielectric layer 60. For example, a portion of semiconductor substrate 48 may be thermally oxidized to form a thermal oxide layer along the sidewall and bottom of trenches 58 prior to depositing dielectric layer 60. Note, the trench liner will have a thickness which is insufficient to fill trenches 58.

Figure 6:
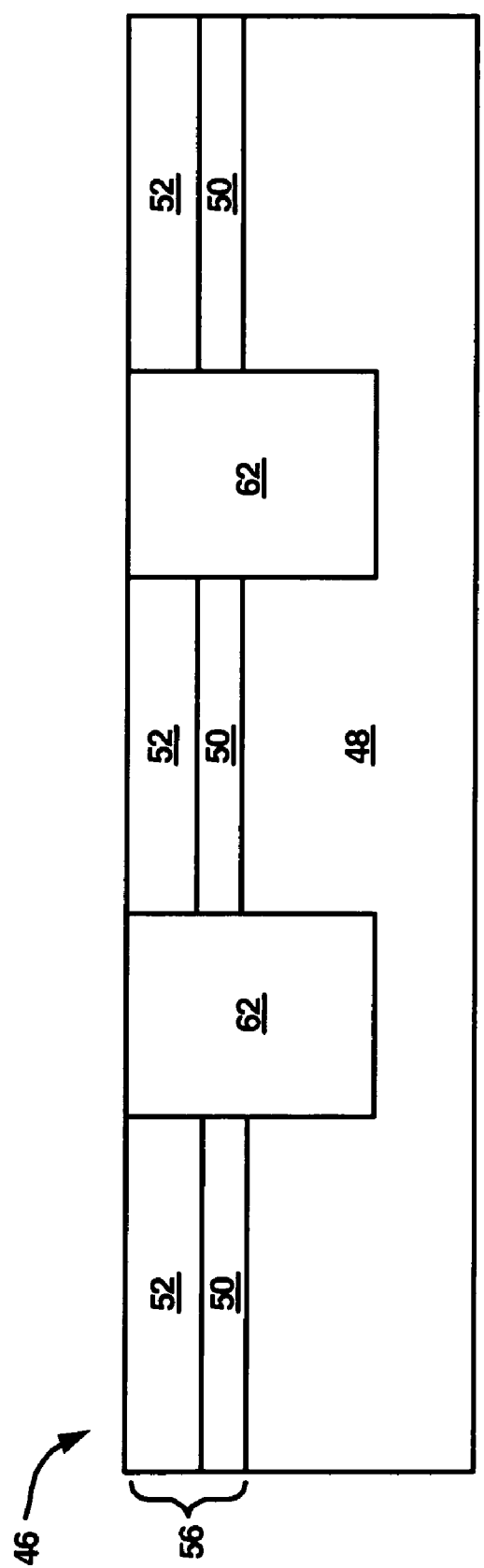

In FIG. 6, dielectric layer 60 is then uniformly polished, as described above in FIG. 1, to expose a portion of patterned trench mask 56, and leave a remaining portion 62 of dielectric layer 60 in trenches 58. In one embodiment, dielectric layer 60 is a layer of silicon oxide and is polished using a slurry comprising potassium hydroxide, deionized water, and a silica abrasive. Alternatively, dielectric layer 60 may be polished using a slurry comprising potassium hydroxide, deionized water, and an alumina abrasive, or using a slurry comprising ammonium hydroxide, deionized water, and a silica abrasive. After being exposed, patterned trench mask 56 is then subsequently removed to define active regions and trench isolation regions within semiconductor substrate 48 (not shown). Patterned trench mask 56 is removed using a wet or a dry etch process, or a combination thereof.

Figure 7:
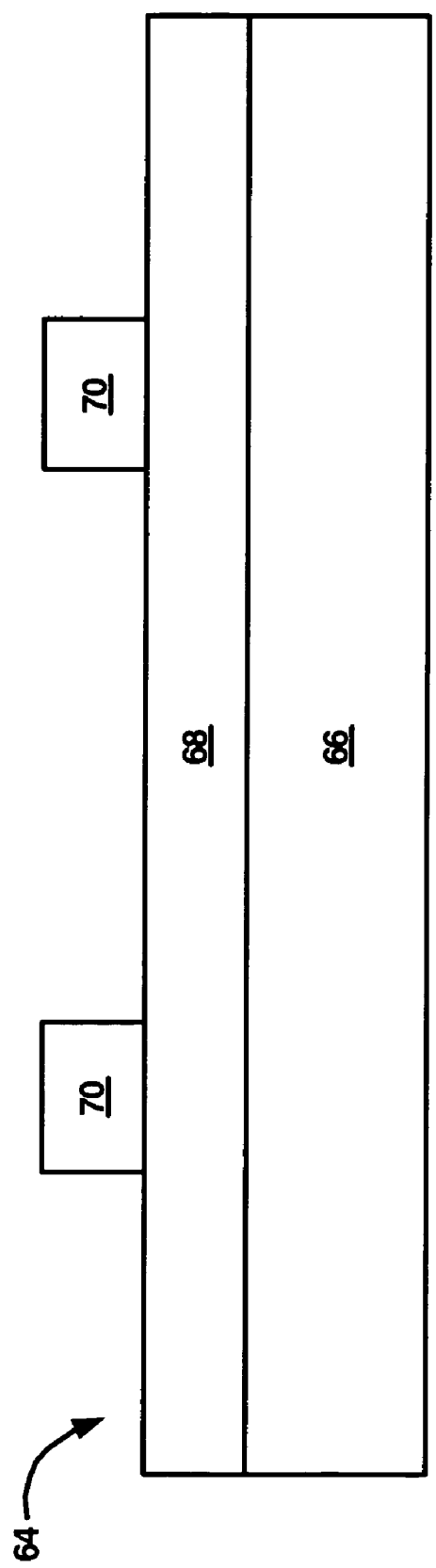
FIGS. 7–9 illustrate, in cross-section, process steps in accordance with another embodiment of the present invention.
Figure 8:
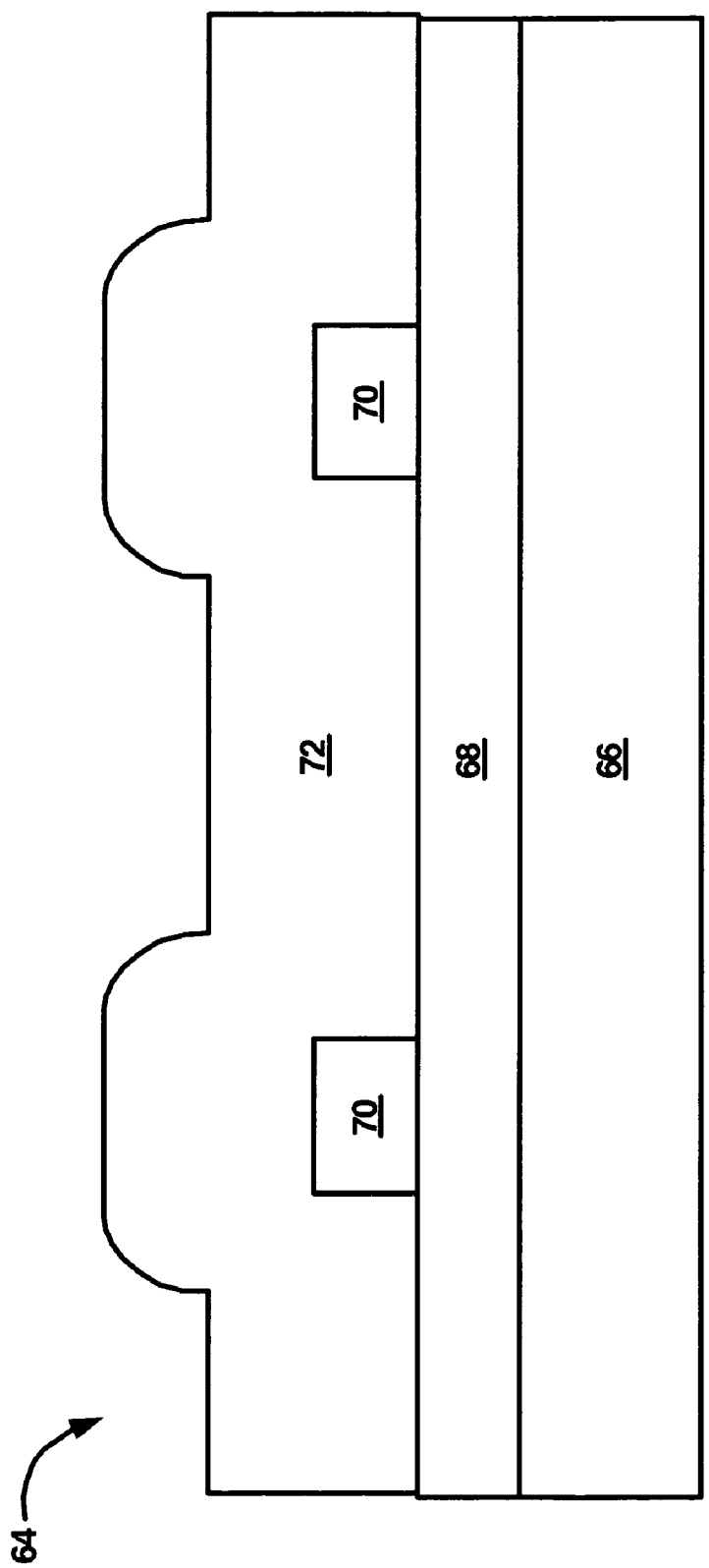
Figure 9:
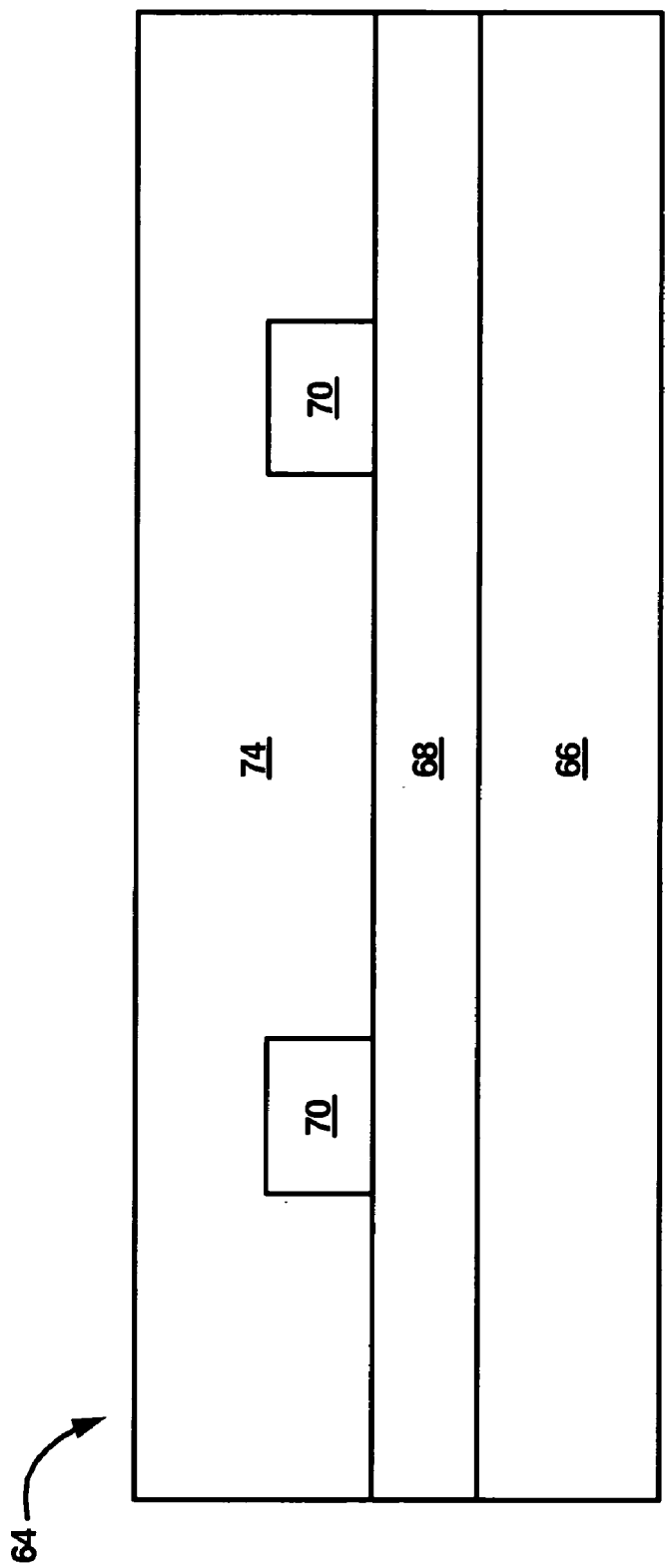

FIG. 7 through FIG. 9 illustrate, in cross-section, process steps in accordance with one embodiment of the present invention, wherein a planarized interlevel dielectric layer is formed in an integrated circuit. Shown in FIG. 7, is a portion 64 of an integrated circuit structure comprising a semiconductor substrate 66, a dielectric layer 68, and patterned conductive members 70. Semiconductor substrate 66 is similar to semiconductor substrate 48 of FIG. 3. In one embodiment, dielectric layer 68 is a gate dielectric layer. In an alternative embodiment, dielectric layer 68 is an interlevel dielectric layer. If dielectric layer 68 is a gate dielectric layer, then semiconductor substrate 66 is preferably thermally oxidized to form dielectric layer 68. It should be appreciated, however, that other dielectric materials, such as silicon oxynitride or chemical vapor deposited silicon dioxide may also be used to form a gate dielectric layer. If dielectric layer 68 is an interlevel dielectric layer then dielectric layer 68 may be a layer of silicon dioxide, a layer of silicon nitride, a layer of boro-phosphate-silicate-glass (BPSG), a layer of phosphate-silicate-glass (PSG), a layer of spin-on-glass (SOG), a silicon oxynitride layer, a polyimide layer, or the like. In addition, a combination of the foregoing dielectric materials may also be used to form dielectric layer 68. After dielectric layer 68 is formed, a conductive layer of material is formed overlying dielectric layer 68, and then patterned using conventional lithographic processes to form conductive members 70. Conductive members 70 may be formed using a doped polysilicon layer, a metal layer, a metal silicide layer, a metal nitride layer, or a combination thereof.

In FIG. 8, a dielectric layer 72 is then formed overlying semiconductor substrate 66. Dielectric layer 72 may be a layer of silicon dioxide, a layer of silicon nitride, a layer of boro-phosphate-silicate-glass (BPSG), a layer of phosphate-silicate-glass (PSG), a layer of spin-on-glass (SOG), a silicon oxynitride layer, a polyimide layer, or the like. In addition, a combination of the foregoing dielectric materials may also be used to form dielectric layer 72.

In FIG. 9, dielectric layer 72 is then uniformly polished, as described above in FIG. 1, to form a planarized interlevel dielectric layer 74. In one embodiment, dielectric layer 72 is a layer of silicon oxide and is polished using a slurry comprising potassium hydroxide, deionized water, and a silica abrasive. Alternatively, dielectric layer 72 may be polished using a slurry comprising potassium hydroxide, deionized water, and an alumina abrasive, or using a slurry comprising ammonium hydroxide, deionized water, and a silica abrasive.

Figure 10:
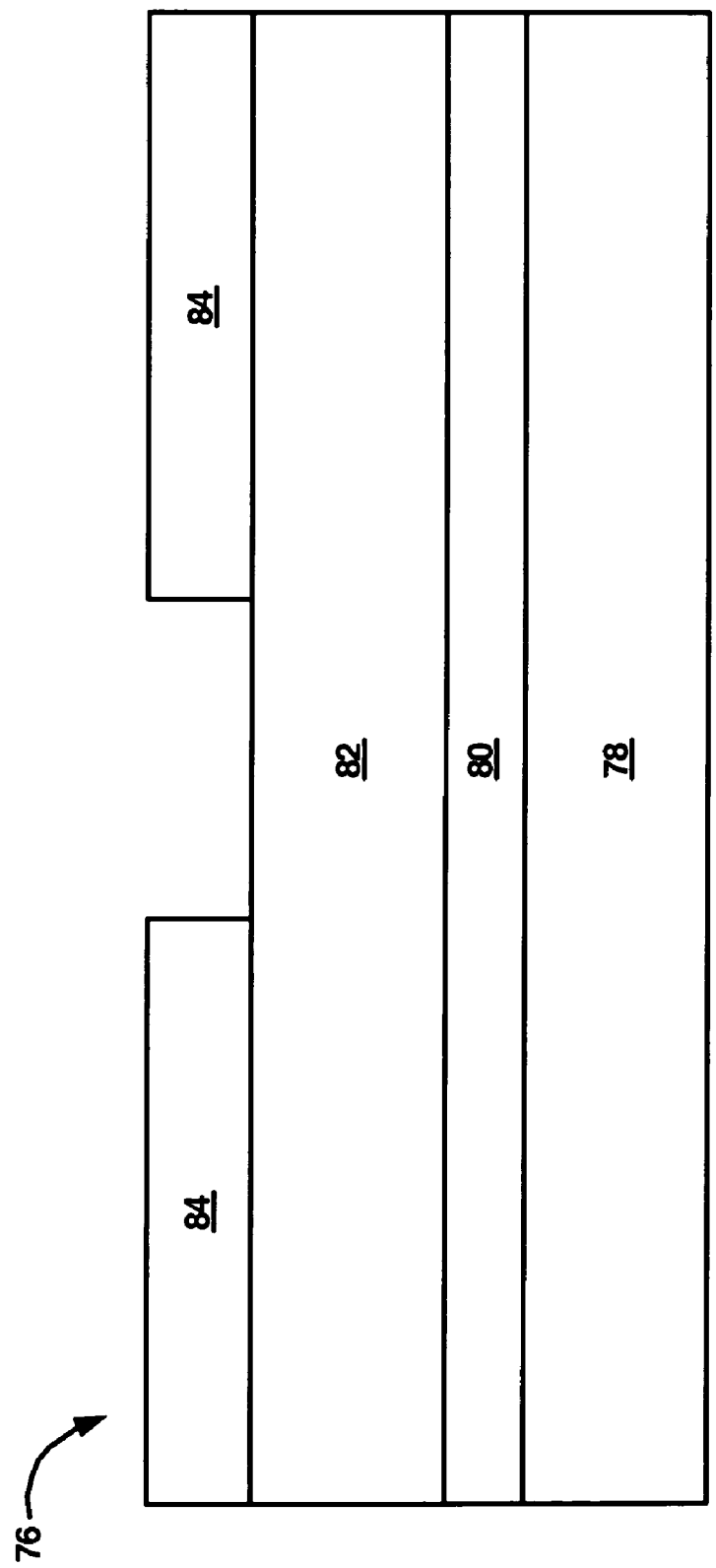
FIGS. 10–13 illustrate, in cross-section, process steps in accordance with another embodiment of the present invention.

FIG. 10 through FIG. 13 illustrate, in cross-section, process steps in accordance with one embodiment of the present invention, wherein a conductive member is formed in an integrated circuit. Shown in FIG. 10, is a portion 76 of an integrated circuit structure comprising a semiconductor substrate 78, a conductive region 80, a dielectric layer 82, and a photoresist mask 84. Semiconductor substrate 78 is similar to semiconductor substrate 48 of FIG. 3. In one embodiment conductive region 80 is a doped region which has been formed within a portion of semiconductor substrate 78. For example, it may be a doped source region, a doped drain region, a doped well contact, or the like. In an alternative embodiment, conductive region 80 is a patterned conductive member, such as a gate electrode, a contact plug, a via plug, an interconnect, or the like. Note, that if conductive region 80 is a gate electrode, a via plug, or an interconnect, then at least one dielectric layer (not shown) will lie between conductive region 80 and semiconductor substrate 78. Dielectric layer 82 may be a layer of silicon dioxide, a layer of silicon nitride, a layer of boro-phosphate-silicate-glass (BPSG), a layer of phosphate-silicate-glass (PSG), a layer of spin-on-glass (SOG), a silicon oxynitride layer, a polyimide layer, or the like. In addition, a combination of the foregoing dielectric materials may also be used to form dielectric layer 82. Photoresist mask 84, which overlies a portion of dielectric layer 82, is formed using standard photolithographic patterning processes.

Figure 11:
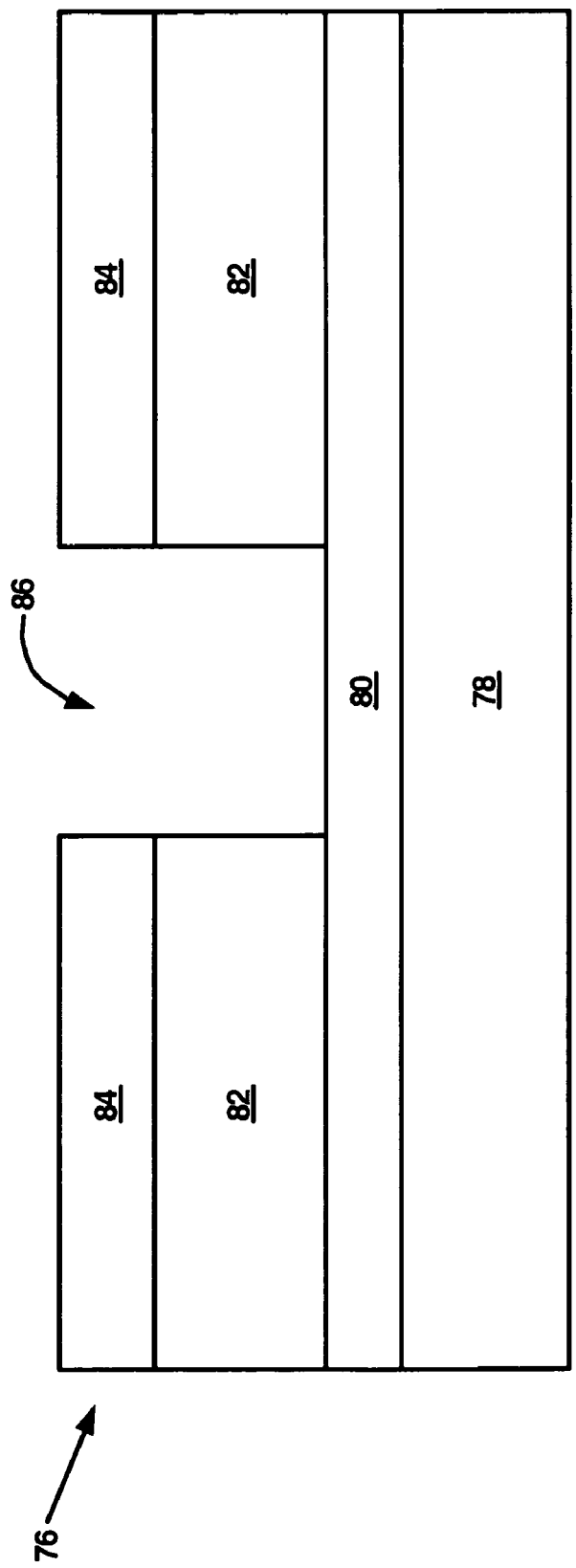

In FIG. 11, dielectric layer 82 is etched using photoresist mask 84 to form an opening 86 within dielectric layer 82. A portion of conductive region 80 is exposed within opening 86, as shown in FIG. 11. It should be appreciated that dielectric layer 82 may be etched using a wet or a dry etch process, or a combination thereof.

Figure 12:
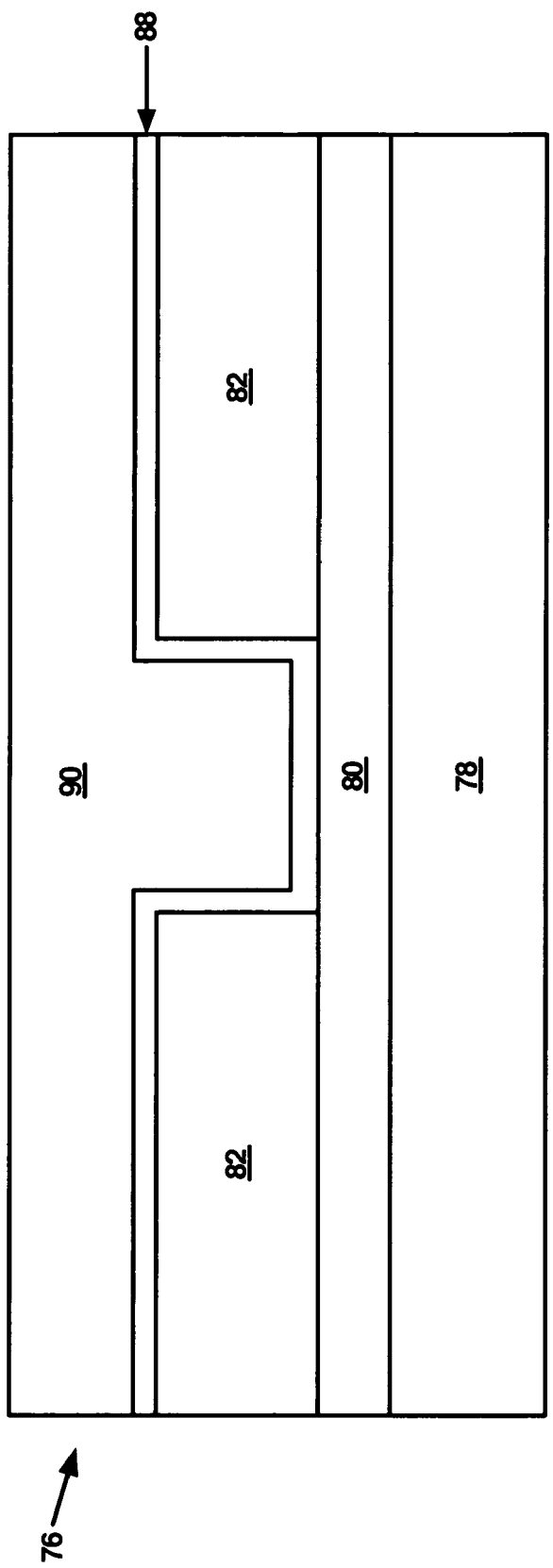

In FIG. 12, a barrier layer 88 is then formed overlying semiconductor substrate 78. Barrier layer 88 overlies dielectric layer 82 and lies within opening 86, such that it does not fill opening 86. A conductive layer 90 is then formed overlying barrier layer 88, such that opening 86 is substantially filled by conductive layer 90. Barrier layer 88 may be a metal nitride layer, such as titanium nitride, tantalum nitride, tungsten nitride, tantalum-silicon nitride, or the like, or a metal layer, such a layer of titanium, a layer of tantalum, a layer of tungsten, or the like, or a combination thereof. For example, barrier layer 88 may be a composite layer of titanium and titanium nitride. Conductive layer 90 may be an aluminum layer, an aluminum alloy layer, a copper layer, a tungsten layer, a doped polysilicon layer, or the like.

Figure 13:
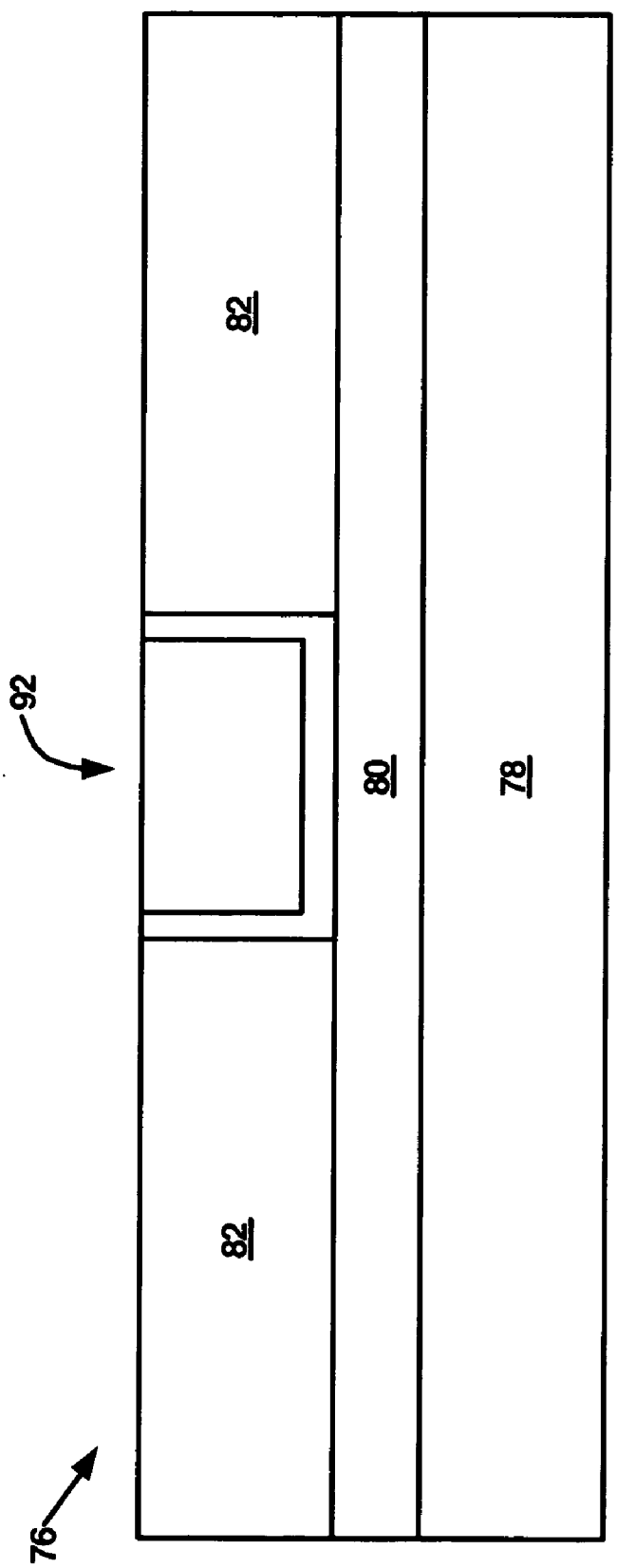

In FIG. 13, conductive layer 90 and barrier layer 88 are then uniformly polished, as described above in FIG. 1, to form a conductive member 92, such as a contact plug, a via plug, or an inlaid interconnect. In one embodiment, wherein conductive layer 90 is a tungsten layer and barrier layer 88 comprises titanium nitride, a slurry comprising ferric nitrate, deionized water, and a silica abrasive is used to form conductive member 92. Alternatively, tungsten and titanium nitride may also be polished using a slurry comprising hydrogen peroxide, deionized water, and a silica abrasive. In an alternative embodiment, wherein conductive layer 90 is a copper layer and barrier layer 88 comprises tantalum, a slurry comprising hydrogen peroxide, deionized water, and a silica abrasive is used to form conductive member 92.

Thus it is apparent that there has been provided, in accordance with the present invention, a polishing apparatus and a method for polishing a layer of material in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What is claimed is:

1. A polishing apparatus comprising:
   a polishing platen;
   a polishing pad overlying the polishing platen, the polishing pad having a first polishing region, a second polishing region, and a third polishing region, wherein the second polishing region lies between the first polishing region and the second polishing region;
   a carrier; and
   an alignment detector, wherein the alignment detector is used to align the carrier to the second polishing region of the polishing pad, wherein the first polishing region comprises a first plurality of holes having a first hole depth and a first hole width, the second polishing region comprises a second plurality of holes having a second hole depth and a second hole width, and the third polishing region comprises a third plurality of holes having a third hole depth and a third hole width wherein the second hole depth is greater than the first hole depth and the third hole depth.

2. The polishing apparatus of claim 1, wherein the second hole width is greater than the first hole width and the third hole width.

3. The polishing apparatus of claim 1, wherein the alignment detector comprises a laser.

4. The polishing apparatus of claim 1, wherein the alignment detector comprises a video camera.

5. The polishing apparatus of claim 1, wherein the first polishing region has a first hole density, the second polishing region has a second hole density, and the third polishing region has a third hole density.

6. The polishing apparatus of claim 1, wherein the second hole density is greater than the first hole density and the third hole density.

7. The polishing apparatus of claim 1, wherein the polishing platen comprises an alignment knob.

\* \* \* \* \*